(12) United States Patent
Jursich et al.

(10) Patent No.: US 7,141,500 B2
(45) Date of Patent: Nov. 28, 2006

(54) METHODS FOR FORMING ALUMINUM CONTAINING FILMS UTILIZING AMINO ALUMINUM PRECURSORS

(75) Inventors: Gregory M. Jursich, Clarendon Hills, IL (US); Ronald S. Inman, Lyons, IL (US)

(73) Assignee: American Air Liquide, Inc., Fremont, CA (US)

( * ) Notice: Subject to any disclaimer, the term of this patent is extended or adjusted under 35 U.S.C. 154(b) by 294 days.

(21) Appl. No.: 10/844,579

(22) Filed: May 13, 2004

(65) Prior Publication Data

US 2005/0003662 A1    Jan. 6, 2005

Related U.S. Application Data

(60) Provisional application No. 60/476,273, filed on Jun. 5, 2003, provisional application No. 60/514,757, filed on Oct. 27, 2003.

(51) Int. Cl.
*H01L 21/44* (2006.01)
(52) U.S. Cl. .................. 438/688; 438/197; 438/381; 257/E21.28; 257/E21.269; 257/E21.292
(58) Field of Classification Search ............... 438/688, 438/197, 381, 680, 681, 683, 685, 648, 650
See application file for complete search history.

(56) References Cited

U.S. PATENT DOCUMENTS

| | | | |
|---|---|---|---|
| 6,090,442 A * | 7/2000 | Klaus et al. | 427/255.15 |
| 6,159,855 A | 12/2000 | Vaartstra | |
| 6,348,412 B1 | 2/2002 | Vaartstra | |
| 6,624,072 B1 | 9/2003 | Vaartstra | |
| 7,041,609 B1 | 5/2006 | Vaartstra | |
| 2002/0175393 A1 | 11/2002 | Baum et al. | |
| 2002/0180028 A1 | 12/2002 | Borovik et al. | |
| 2002/0187644 A1 | 12/2002 | Baum et al. | |

FOREIGN PATENT DOCUMENTS

| WO | WO 02 27063 | 4/2002 |
|---|---|---|
| WO | WO 02/079211 A1 | 10/2002 |

OTHER PUBLICATIONS

International Search Report for PCT/IB2004/001642.
Rie, K. et al: "Plasma-CVD of TiCN and ZrCN films on light metals", Surface and Coatings Technology, Elsevier, Switzerland, vol. 112, No. 1-3, Feb. 1, 1999, pp. 226-229.
Takahashi, Y., et al.: "Low temperature deposition of a refractory aluminium compound by the thermal decomposition of aluminium dialkylamides", Surface Science, Netherlands, vol. 86, No. 2, Jul. 2, 1979, pp. 238-245.

\* cited by examiner

*Primary Examiner*—David Nhu
(74) *Attorney, Agent, or Firm*—Christopher J. Cronin

(57) ABSTRACT

A method of forming an aluminum containing film on a substrate includes providing a precursor having the chemical structure: $Al(NR_1R_2)(NR_3R_4)(NR_5R_6)$; where each of $R_1$, $R_2$, $R_3$, $R_4$, $R_5$ and $R_6$ is independently selected from the group consisting of hydrogen and an alkyl group including at least two carbon atoms. The precursor is utilized to form a film on the substrate including at least one of aluminum oxide, aluminum nitride and aluminum oxy-nitride. Each of the $R_1$–$R_6$ groups can be the same or different and can by straight or branched chain alkyls. An exemplary precursor that has is useful in forming aluminum containing films is tris diethylamino aluminum.

22 Claims, 1 Drawing Sheet

METHODS FOR FORMING ALUMINUM CONTAINING FILMS UTILIZING AMINO ALUMINUM PRECURSORS

CROSS-REFERENCE TO RELATED APPLICATIONS

This application claims priority from U.S. Provisional Patent Application Ser. No. 60/476,273, entitled "Aluminum diethylamide as Precursor for Deposition of Aluminum Oxide Films", and filed Jun. 5, 2003, and U.S. Provisional Patent Application Ser. No. 60/514,757, entitled "Precursors for Deposition of Aluminum Containing Films, and Methods Therefor", and filed Oct. 27, 2003. The disclosures of these provisional patent applications are incorporated herein by reference in their entireties.

BACKGROUND OF INVENTION

1. Field of Invention

The present invention pertains to the formation of aluminum containing films. More particularly, this invention pertains to chemical precursors for forming aluminum containing films.

2. Related Art

Aluminum oxide films have good electrical insulating properties and a high dielectric constant, which renders these films extremely advantageous as layer materials in integrated circuit designs. For example, aluminum oxide containing films are playing important roles in transistor and capacitor fabrication used in microprocessor and memory devices. Further, as integrated circuit device scaling dimensions continue to reduce into the nanometer scale, these films are likely to play a crucial role in forming dielectric films of future gate insulator layers in MOSFET transistors and capacitive structures of DRAM devices. In particular, recent advances in semiconductor technology have shown aluminum oxide containing films to be to be a superior material in certain critical applications such as the gate dielectric layer in MOSFET transistors and the capacitive storage media in DRAM memory devices.

In addition to having desirable electrical properties, $Al_2O_3$ films have good chemical inertness and mechanical strength properties. Thus, $Al_2O_3$ films are also used extensively in non-electronic circuit applications such as protective layers on hard disk heads, integrated circuit packaging, and anti-corrosion barriers for metal alloys.

Deposition of $Al_2O_3$ has traditionally been accomplished by means of chemical vapor deposition (CVD) or atomic layer deposition (ALD) using various aluminum precursors (e.g., alkyl aluminum and alkyl aluminum hydride compounds) in conjunction with an oxygen source. In thin film deposition for semiconductor fabrication, ALD is particularly desirable because of the need to deposit very thin, very uniform layers of, e.g., $Al_2O_3$ in continually shrinking semiconductor devices. One class of precursors commonly used in CVD includes the trialkylaluminum precursors, such as trimethyl aluminum (TMA). See, e.g., M. Gustin and R. G. Gordon, *Journal of Electronic Materials*, Volume 17, pages 509–517 (1988).

Aluminum isopropoxide has also been used as a precursor to deposit aluminum oxide. See, e.g., J. A. Aboaf, *Journal of Electrochemical Society*, Volume 114, pages 948–952 (1967). However this compound polymerizes easily and thus exists as a mixture of isomers, each with a different vapor pressure. Consequently, the vaporization of this precursor is unpredictable and difficult to control. In addition, aluminum 2-ethyhexanoate has been demonstrated as a precursor for $Al_2O_3$ deposition, but its low vapor pressure results in low deposition rates, which limits the usefulness of this compound in situations where high throughput is desired. See, e.g., T. Maruyama and T. Nakai, *Applied Physics Letters*, Volume 58, pp. 2079–2080 (1991).

One disadvantage associated with using alkyl aluminum compounds as precursors to form aluminum oxide films is that many are pyrophoric (i.e., igniting spontaneously in air) and hence present significant safety hazards in their use. There is a strong interest in industry today to avoid such risk if possible. A related disadvantage is the high reactivity of these compounds with oxygen that can result in the formation of powdered alumina in the vapor phase in a CVD chamber, particularly when excess oxygen is present.

The following sets forth a list of volatile Al compounds that can potentially be used for the various film deposition applications:

| Compound | Phase at Temperature/Pressure | Pyrophoric or Non-pyrophoric |
| --- | --- | --- |
| $AlH(Me)_2$ | liquid at ~65° C./2.13 kPa | pyrophoric |
| $Al(Me)_3$ | liquid at 20° C./1.07 kPa | pyrophoric |
| $Al(Et)_2Cl$ | liquid | pyrophoric |
| $Al(Et)_3$ | liquid at 186° C./101.3 kPa | pyrophoric |
| $Al(Acac)_3$ | solid at 150° C./0.13 kPa | non-pyrophoric |
| $Al(6Facac)_3$ | solid at 50° C./13.3 Pa | non-pyrophoric |
| $Al(Thd)_3$ | solid at 150° C./1.33 Pa | non-pyrophoric |
| $Al(i\text{-}OPr)_3$ | solid at 132° C./0.80 kPa | non-pyrophoric |
| $Al(t\text{-}OBu)_3$ | 156° C./0.27 kPa | |
| $Al_2(Et)_3(s\text{-}OBu)_3$ | liquid at ~185° C./5.33 kPa | non-pyrophoric | where:
Me = methyl;
Et = ethyl;
Opr = propoxide;
Obu = butoxide;
Acac = acetylacetonate (2,4 pentanedionate);
Thd = tetramethylheptanedionate; and
6Facac: hexafluoroacetylacetonate.

Several of the potential precursors listed above have sufficient volatility for effective use in an aluminum deposition process. However, many of these compounds are also pyrophoric and present substantial safety risks in their use, particularly in industrial environments. In addition to pyrophoricity, these compounds contain aluminum-carbon (Al—C) bonds that are undesirable in high dielectric insulating applications due to the potential of carbon incorporation of the film, which in turn leads to reduced resistivity. This has obvious disadvantages in gate dielectric and capacitor films as it leads to an increase in leakage current.

In addition, many of the remaining non-pyrophoric candidates in the above list contain aluminum-oxygen (Al—O) bonds. These bonds are quite strong (122 kcal/mol) compared to aluminum-nitrogen (AlN) bonds (71 kcal/mol), and thus it is quite difficult to substitute nitrogen for oxygen in a deposition process. To do so would require an additional process step in the overall film deposition (typically plasma nitridation). Increasing process steps decreases overall reliability, a factor that is critical for sustaining economic competitiveness in the semiconductor industry today.

Further use of higher energy processes, such as high temperatures or plasma, increases processing operating costs as well and can be detrimental to the quality of the critical gate dielectric layer of transistors in CMOS devices. Thus, it is desirable to utilize a precursor without a strong Al—O bond to form an aluminum oxide or other film, as this type of precursor provides the advantage of process tunability between oxide and nitride via process chemistry.

Aluminum dimethyl amide has been used to deposit aluminum nitride (AlN) films (see, e.g., *J. Vac. Soc. Technol.*, 1996, 14, 306). In principle, it would appear that this compound might also yield $Al_2O_3$ in the presence of an oxidizer. However, this compound exists as a dimer and is solid at room temperature. Both of these attributes are not good characteristics for a vapor deposition process.

SUMMARY OF THE INVENTION

Accordingly, it is an object of the present invention to provide a deposition process for forming a film of aluminum oxide, aluminum nitride, or aluminum oxy-nitride by CVD or ALD utilizing a non-pyrophoric amino aluminum precursor.

It is another object of the present invention to provide an amino aluminum precursor that excludes halogens, Al—O bonds and/or Al—C bonds for the deposition process.

It is a further object of the present invention to provide an amino aluminum precursor that is compatible with a hafnium precursor to facilitate the incorporation of $Al_2O_3$ into a hafnium oxide ($HfO_2$) film.

The aforesaid objects are achieved individually and/or in combination, and it is not intended that the present invention be construed as requiring two or more of the objects to be combined unless expressly required by the claims attached hereto.

In accordance with the present invention, a method of forming an aluminum containing film on a substrate includes: providing a precursor having the chemical structure:

$$Al(NR_1R_2)(NR_3R_4)(NR_5R_6);$$

where each of $R_1$, $R_2$, $R_3$, $R_4$, $R_5$ and $R_6$ is independently selected from the group consisting of hydrogen and an alkyl group including at least two carbon atoms; and utilizing the precursor to form a film on the substrate including at least one of aluminum oxide, aluminum nitride and aluminum oxy-nitride. Each of the $R_1$–$R_6$ groups can be the same or different and can further be straight or branched alkyl portions or moieities. For example, the alkyl for any of the $R_1$–$R_6$ groups can be a straight chain group having the formula $(CH_2)_nCH_3$, with n being at least 1 (e.g., ethyl, propyl, butyl, etc.). Alternatively, the alkyl for any $R_{1-6}$ group can be a branched chain group including, without limitation, isopropyl, isobutyl, tert-butyl, etc.

The alkyl group for each of the $R_1$–$R_6$ groups may contain six carbon atoms. Preferably, the alkyl group for each of the $R_1$–$R_6$ groups contains no more than five carbon atoms. In particular, a preferred precursor that has been found useful in forming aluminum containing films by CVD or ALD is tris diethylamino aluminum, or $Al(NEt_2)_3$. In addition, it is noted that the precursors utilized in forming aluminum containing films of the invention exclude Al—O and Al—C bonds.

The precursor may be used to deposit aluminum oxide ($Al_2O_3$) films, aluminum nitride (AlN) films, and/or aluminum oxy-nitride (Al—O—N) films. A combination of precursors of the above formula may be used, wherein they have the same or different structure. Preferably, only one precursor is used to deposit aluminum nitride films or $Al_2O_3$ films. Preferably, moisture is used as a co-reagent. Preferably, the O:N ratio is controlled for oxy-nitride films.

Although there is no oxygen in the precursor structure, an oxide or oxy-nitride film can be generated by use of a variety of oxygen containing co-reactant vapors. With such co-reactants, deposition of oxy or oxy-nitride films may be accomplished by either chemical vapor deposition (CVD), or atomic layer deposition (ALD). In either case, the precursor is first vaporized prior to entering a reaction chamber that contains a substrate for deposition. The precursor may be used alone or in combination with another precursor according to the invention, or a different precursor not having the above formula. In the latter case, two separate vaporizers are preferred in depositing the film.

The formation of an $Al_2O_3$ film is accomplished by introducing a co-reactant oxidizing vapor into the chamber. By reducing the ratio of oxidizer to precursor, the use of co-reactant chemistry provides tunability in the chemical stoichiometry of the film from $Al_2O_3$ to Al—O—N to AlN. This has the further benefit being able to fine tune electrical film properties via stoichiometry to best suit the application.

Possible sources of oxidizers suitable for use in practicing the present invention include, without limitation, oxygen, nitrogen oxides, $CO_2$, water, alcohols, and silanols, where the specific choice of a suitable oxidizer will depend on reaction conditions. Tris diethylamino aluminum, for example, provides good $Al_2O_3$ films using $H_2O$ as the co-reactant in a CVD or ALD process. In particular, when utilizing this precursor in an ALD process, highly conformal films are generated with extremely thin thickness (e.g., less than about 100 angstroms). These are ideal attributes for high dielectric layers in gate oxide films, MOSFETs and capacitive structures in DRAM memory.

The alkyl amino Al precursors are particularly useful in the deposition process of the present invention because they are non-pyrophoric, free from any oxygen, halide (e.g., chlorine), or metal carbon bond. These precursors provide a great benefit in safety along with flexibility in controlling oxide stoichiometries.

The above and still further objects, features and advantages of the present invention will become apparent upon consideration of the following detailed description of specific embodiments thereof.

DESCRIPTION OF PREFERRED EMBODIMENTS

Figure 1:
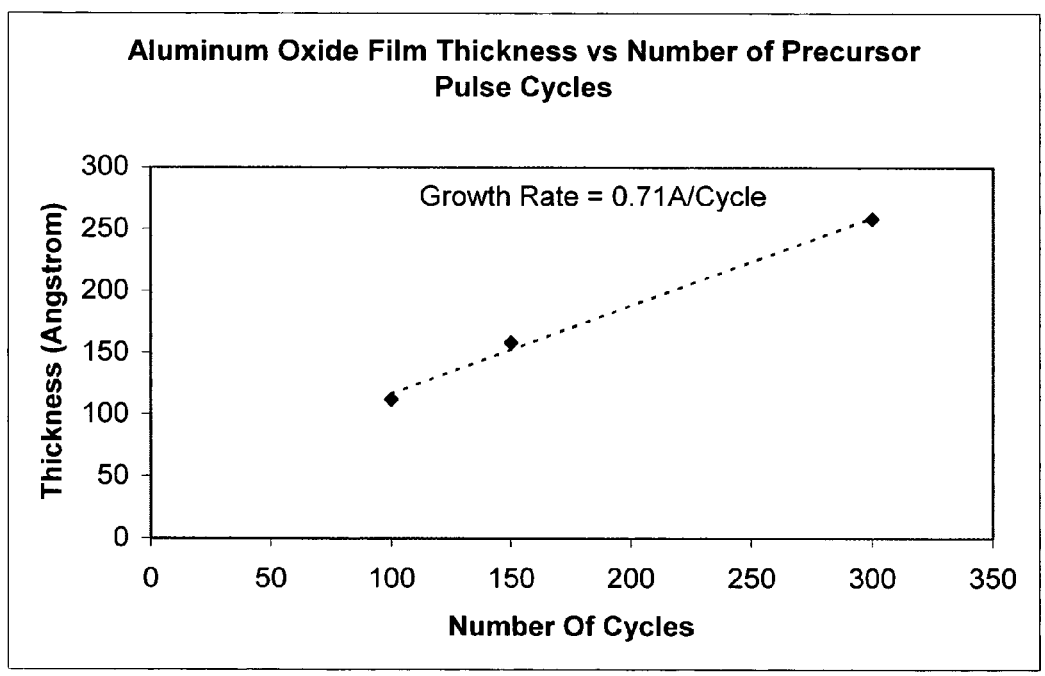
FIG. 1 is a graph depicting the growth rate of an $Al_2O_3$ film utilizing tris diethylamino aluminum in an ALD process in accordance with the present invention.

Aluminum precursors are widely used in the fabrication of electronic devices such as integrated circuits, capacitors, transistors, diodes, and opto-electronic III and IV semiconductor devices. See, e.g., N. N. Greenwood, A. Earnshaw, *Chemistry of the Elements*, Pergamon Press, 1984. In particular, recent advances in semiconductor technology have shown aluminum oxide containing films to be to be the material of choice in certain critical applications such as the gate dielectric layer in MOSFET transistors and the capacitive storage media in DRAM memory devices.

In addition to these desirable electrical properties, $Al_2O_3$ films have good chemical inertness and mechanical strength properties. Thus, $Al_2O_3$ films are also used extensively in non-electronic circuit applications such as protective layers on hard disk heads, integrated circuit packaging, and anti-corrosion barriers for metal alloys.

As noted above, deposition of $Al_2O_3$ films is commonly performed today using precursors such as alkyl aluminum or alkyl aluminum hydride compounds. Many of the precursors utilized are pyrophoric and hence present significant hazards in their use. Accordingly, there is a desire to alleviate the risks associated with such precursors when manufacturing aluminum oxide ($Al_2O_3$) films as well as other films, such as aluminum nitride (AlN) films and aluminum oxynitride (Al—O—N) films.

The method of the present invention includes providing a non-pyrophoric, halogen-free, and oxygen-free amino aluminum compound that is also free of Al—C bonds for use as a precursor in a deposition process to yield an aluminum oxide, aluminum nitride or aluminum oxynitride film. The non-pyrophoric attribute of the precursor tremendously reduces safety risks associated with handling the precursor compound, while the elimination of oxygen from the compound allows for enhanced control of film stoichiometry and hence adaptability of the film properties to the specific application. The absence of Al—C bonds minimizes the risk of carbon incorporation in the film, which in turn lowers film resistivity and decreases electrical performance of the relatively high dielectric insulator material.

In addition, the precursors are preferably halogen free to avoid corrosion to the system piping and chamber for the process as well as to prevent the incorporation of halogens within the film being formed. For example, the presence of chlorine in a precursor could lead to the formation of a chloride film in the end product. Further, halogens are detrimental when disposed in high k dielectric films because they serve as charge trapping sites and can significantly reduce the electrical properties of the film.

It is also preferable that the chemical precursor is in liquid phase prior to use in the deposition process, since a liquid precursor can be delivered to a process chamber in an easier, more consistent and controlled manner in comparison to a solid precursor. Further, avoiding the use of a solid precursor would eliminate the difficulties and inconsistencies associated with sublimation of the precursor during the CVD or ALD process. In addition, the precursor preferably has sufficient volatility to allow for adequate concentration doses of precursor vapor in the deposition process.

Recently, there has been an increased interest in incorporating $Al_2O_3$ into a hafnium oxide ($HfO_2$) film. Thus, compatibility of the amino aluminum precursor with a hafnium precursor is also preferable. An example application where this would be particularly useful is in the deposition of gate dielectric films CMOS devices, where a hafnium aluminate film composition provides desirable electrical properties.

In accordance with the present invention, a general class of amino aluminum precursors that meet the above criteria are alkyl amino aluminum compounds of the following chemical structure:

$Al(NR_1R_2)(NR_3R_4)(NR_5R_6)$;

where each of $R_1$, $R_2$, $R_3$, $R_4$, $R_5$ and $R_6$ is independently selected from the group consisting of hydrogen and an alkyl group including at least two carbon atoms. Each of the $R_1$–$R_6$ groups can be the same or different and can further be straight or branched alkyl portions or moieties. For example, the alkyl for any of the $R_1$–$R_6$ groups can be a straight chain group having the formula $(CH_2)_nCH_3$, with n being at least 1 (e.g., ethyl, propyl, butyl, etc.). Alternatively, the alkyl for any $R_{1-6}$ group can be a branched chain group including, without limitation, isopropyl, isobutyl, tert-butyl, etc. The precursor can further include all straight chain alkyl groups, all branched chain alkyl groups, or combinations thereof.

The precursor may be used to deposit $Al_2O_3$, AlN or Al—O—N films. A combination of precursors of the above chemical structure may be used, where each precursor has the same or different structure as one or more other precursors. Preferably, moisture (i.e., water) is used as a co-reagent in the deposition process. Preferably, only one precursor is used to deposit aluminum nitride films or $Al_2O_3$ films. Preferably, the O:N ratio is controlled for oxy-nitride films.

Preferably, the $Al_2O_3$ film is deposited such that the dielectric constant is at least about 9. Preferably, the $Al_2O_3$ film is deposited such that the conductivity is no greater than about $10^{-6}$ $A/cm_2$ at 1 MV/cm. More preferably, the conductivity is no greater than about $10^{-7}$ $A/cm_2$ at 1 MV/cm. Even more preferably, the conductivity is no greater than about $10^{-8}$ $A/cm_2$ at 1 MV/cm. The preferred deposition process is preferably CVD or ALD. Most preferably, ALD is used to form the film.

The precursor compounds defined by the above chemical structure have many desirable features including, without limitation, they are non-pyrophoric, they have suitable vapor pressures, they exist under certain conditions as liquids at ambient conditions (e.g., diethylamino precursor compounds), they are non-halogenated, and they have no Al—O or Al—C bonds. Further, these precursor compounds are easy to synthesize, are stable in inert atmospheres and are suitable for co-deposition with other precursor compounds (e.g., hafnium precursors) that have common ligands.

One preferred precursor that has been determined to be particularly useful for CVD or ALD deposition of $Al_2O_3$ films is tris diethylamino aluminum, or $Al(NEt_2)_3$. Aluminum oxide films that have been formed using this compound are of very high quality. In addition, this precursor has good chemical compatibility with and is particularly suited for co-deposition with a gate oxide hafnium precursor tetrakis diethylamino hafnium. This compatibility offers the advantage of mixing the two precursors together without concern about undesirable ligand exchange (since both precursors include the same ligand), which in turn facilitates the incorporation of aluminum oxide into hafnium oxide to provide a film currently envisioned as a potential future gate material for sub 90 nm devices. Furthermore, both tetrakis diethylamino hafnium and tris diethylamino aluminum have similar vapor pressures which facilitates co-deposition of the two precursors.

The precursors of the present invention can be deposited utilizing any conventional CVD or ALD process. In tests that were conducted, depositions of $Al_2O_3$ films were achieved using both tris diethylamino aluminum and tris di-isopropylamino aluminum as precursors with $H_2O$ as a co-reactant in an ALD deposition process. In each process, the delivery of precursor and co-reactant into the reactor was accomplished utilizing a manifold that was maintained at a temperature of about 120° C. The moisture pulses were introduced directly into the deposition reactor by means of a pneumatic valve opening for a short time and allowing pure moisture vapor to enter the reactor. The precursor pulses were introduced into the reactor as a diluted mixture of precursor vapor and carrier gas flow. The carrier gas was argon for all of the tests conducted. The concentration of precursor vapor in this mixture was controlled by the vapor pressure of the precursor and carrier gas pressure. In the tests, the carrier gas pressure was typically about a few torr (a few hundred Pa) or less and was flowed over the precursor source material at about 100 standard cubic centimeters (sccm).

For tests conducted utilizing tris diethylamino aluminum as the precursor, process conditions were set as follows:

| | | |
|---|---|---|
| Precursor Temperature = 115° C. | | |
| Substrate Temperature = 300° C. | | |
| ALD Pulse Sequence (per cycle): | Source | 3 seconds |
| | Purge | 5 seconds |
| | Moisture | 0.6 seconds |
| | Purge | 10 seconds |

The resulting film was uniform formed utilizing the tris diethylamino aluminum precursor showed no particulate contamination. Further, the film growth kinetics was observed to be linear at about 0.7 Å thickness per pulse cycle and exhibited self-sustaining growth with precursor pulse duration from 1 to 5 second duration. The data plotted in the graph of FIG. 1 shows the precursor cycle dependence on film thickness on a silicon substrate under the conditions set forth above.

For tests conducted utilizing tris di-isopropylamino aluminum as the precursor, process conditions were set as follows:

| | | |
|---|---|---|
| Precursor Temperature = 80 C | | |
| Substrate Temperature = 300° C. | | |
| ALD Pulse Sequence (per cycle): | Source | 4 seconds |
| | Purge | 8 seconds |
| | Moisture | 0.8 seconds |
| | Purge | 12 seconds |

The tests indicate that the tris di-isopropylamino aluminum precursor also deposits a uniform film in an ALD process. In this case, a film of about 150 Å thickness was formed after 150 cycles of reagent pulses (i.e., showing linear growth kinetics at about 1 Å film thickness per pulse cycle).

As noted above, the alkylamino aluminum precursors of the present invention can also be used in deposition of $Al_2O_3$, AlN and Al—O—N films.

While it is known to utilize tris dimethylamino aluminum ($Al(NMet_2)_3$) compounds as precursors to form AlN films, there are advantages in using higher alkyl amino aluminum compounds in accordance with the present invention (such as diethyl or higher branched or straight carbon chain amino aluminum compounds), rather than methyl amino aluminum compounds. For example, higher alkyl amino aluminum compounds are less susceptible to self degradation by oligomerization. The oligomerization degradation is a well known problem with many types of organometallic compounds and occurs via bridge bonding, where the nitrogen atom on the ligand of one molecule forms an additional bond interaction to the metal of another. This undesirable process can be prevented or limited by utilizing compounds having larger alkyl groups so as to shield the metal site of one compound from another. Thus, the utilization of higher alkyl groups in the alkyl aluminum precursor compounds offers greater stability to the compounds during the deposition process.

Another advantage of using the larger alkyl amino groups such as a diethyl amino compound is that, unlike methyl amino aluminum compounds, many of the higher alkyl aluminum compounds exist as liquids under appropriate processing conditions and are thus easier to control and provide more consistent delivery to the deposition tool. While solvents can be used to dissolve solids to form liquid solutions in order to control delivery of the precursor, the use of such solvents increases the risk of solvent reaction in the process and ultimately leading to carbon contamination in the film and/or variability of available oxidizer needed to form the film.

A further advantage of providing larger alkyl groups, such as diethyl, isopropyl and/or isobutyl amino type ligands, in the precursor is that such compounds facilitate the formation of stable byproducts (e.g., ethylene, isopropylene, t-butylene, etc.) during film deposition. This offers deposition chemistries in thermal oxidization or a pyrolytic type film deposition mechanisms that can be initiated under less severe process conditions such as lower temperatures, the utilization of milder oxidizers, etc., which is advantageous in terms of process costs, material requirements, and process reliability.

Having described novel methods for forming aluminum containing films utilizing amino aluminum precursors, it is believed that other modifications, variations and changes will be suggested to those skilled in the art in view of the teachings set forth herein. It is therefore to be understood that all such variations, modifications and changes are believed to fall within the scope of the present invention as defined by the appended claims.

The invention claimed is:

1. A method of forming an aluminum containing film on a substrate comprising:

providing a precursor having a chemical structure:

$Al(NR_1R_2)(NR_3R_4)(NR_5R_6)$;

wherein each of $R_1$, $R_2$, $R_3$, $R_4$, $R_5$ and $R_6$ is the same or different and is independently selected from the group consisting of hydrogen and an alkyl group including at least two carbon atoms; and utilizing the precursor to form a film on the substrate including at least one of aluminum oxide, aluminum nitride and aluminum oxy-nitride.

2. The method of claim 1, wherein the alkyl group includes no more than six carbon atoms.

3. The method of claim 1, wherein the precursor comprises tris diethylamino aluminum.

4. The method of claim 1, wherein the film is formed on the substrate by chemical vapor deposition.

5. The method of claim 1, wherein the film is formed on the substrate by atomic layer deposition.

6. The method of claim 5, wherein the thickness of the film formed on the substrate by atomic layer deposition is no greater than about 100 angstroms.

7. The method of claim 1, further comprising: combining a co-reactant with the precursor to form the film.

8. The method of claim 7, wherein the co-reactant is selected from the group consisting of water, oxygen, nitrogen oxide, carbon dioxide, alcohol, silanol, and combinations thereof.

9. The method of claim 1, further comprising:

forming an electronic device utilizing the substrate including the film formed on the substrate.

10. The method of claim 9, wherein the electronic device includes a dielectric layer comprising the film formed on the substrate.

11. The method of claim 9, wherein the electronic device includes a storage media layer comprising the film formed on the substrate.

12. The method of claim 1, wherein the precursor is co-deposited with a second precursor to form a film including at least one of aluminum oxide, aluminum nitride, and aluminum oxy-nitride.

13. The method of claim 12, wherein the precursor comprises tris diethylamino aluminum, the second precursor comprises tetrakis diethylamino hafnium, and the film includes aluminum oxide and hafnium oxide.

14. The method of claim 1, wherein the precursor comprises tris diethylamino aluminum and is co-deposited with a second precursor to form a film including at least one of aluminum oxide, aluminum nitride, and aluminum oxy-nitride.

15. The method of claim 1, further comprising the steps of:
   providing a second precursor;
   creating a mixture of the precursor and the second precursor; and
   codepositing the mixture by chemical vapor deposition or atomic layer deposition to form the film on the substrate that includes at least one of aluminum oxide, aluminum nitride and aluminum oxy-nitride.

16. The method of claim 1, further comprising the steps of:
   providing a second precursor;
   creating a mixture of the precursor and the second precursor; and
   codepositing the mixture by chemical vapor deposition or atomic layer deposition to form the film on the substrate that includes at least one of aluminum oxide, aluminum nitride and aluminum oxy-nitride, wherein the precursor codeposited with the second precursor comprises tris diethylamino aluminum.

17. The method of claim 1, further comprising the steps of:
   providing a second precursor comprising tetrakis diethylamino hafnium;
   creating a mixture of the precursor and the second precursor; and
   codepositing the mixture by chemical vapor deposition or atomic layer deposition to form the film on the substrate that includes at least one of aluminum oxide, aluminum nitride and aluminum oxy-nitride, wherein the precursor codeposited with the second precursor comprises tris diethylamino aluminum.

18. The method of claim 17, wherein the film includes aluminum oxide and hafnium oxide.

19. The method of claim 1, wherein the film includes aluminum oxide.

20. The method of claim 1, wherein the film includes aluminum nitride.

21. The method of claim 1, wherein the film includes aluminum oxy-nitride.

22. The method of claim 1, further comprising the steps of:
   providing a second precursor comprising tetrakis diethylamino hafnium;
   creating a mixture of the precursor and the second precursor; and
   codepositing the mixture by chemical vapor deposition or atomic layer deposition to form the film on the substrate, wherein the precursor codeposited with the second precursor comprises tris diethylamino aluminum and the film on the substrates comprises aluminum, halfnium and oxygen.

* * * * *